United States Patent
Kumar et al.

(10) Patent No.: US 12,040,798 B1
(45) Date of Patent: Jul. 16, 2024

(54) CLOCK DISTRIBUTION ARCHITECTURE

(71) Applicant: Cadence Design Systems, Inc., San Jose, CA (US)

(72) Inventors: Vinod Kumar, Uttar Pradesh (IN);
Prakash Kumar Lenka, Orissa (IN);
Harsh Anil Shakrani, Maharashtra (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/731,387

(22) Filed: Apr. 28, 2022

(51) Int. Cl.
| G11C 11/4076 | (2006.01) |
| G06F 1/10 | (2006.01) |
| G11C 11/409 | (2006.01) |
| H03K 3/011 | (2006.01) |
| H03K 3/012 | (2006.01) |

(52) U.S. Cl.
CPC ............... *H03K 3/011* (2013.01); *G06F 1/10* (2013.01); *G11C 11/4076* (2013.01); *G11C 11/409* (2013.01); *H03K 3/012* (2013.01)

(58) Field of Classification Search
CPC .................... G06F 1/10; H03K 3/011
USPC ...................................... 365/189.15
See application file for complete search history.

(56) References Cited

U.S. PATENT DOCUMENTS

| 5,838,150 | A | * | 11/1998 | Keeth | G05F 3/247 |
| | | | | | 323/349 |
| 2013/0002343 | A1 | * | 1/2013 | Wong | H02M 3/07 |
| | | | | | 327/536 |
| 2014/0210545 | A1 | * | 7/2014 | Leibowitz | G05F 1/462 |
| | | | | | 327/540 |
| 2016/0352217 | A1 | * | 12/2016 | Reddy | H03K 17/687 |

\* cited by examiner

*Primary Examiner* — Muna A Techane
(74) *Attorney, Agent, or Firm* — Mark H. Whittenberger; Holland & Knight LLP

(57) ABSTRACT

Embodiments included herein are directed towards a voltage-temperature drift resistant and power efficient clock distribution circuit. Embodiments may include a current generator and a voltage generator configured to receive an input from the current generator. Embodiments may also include a regulator which may be configured to receive a reference voltage from the voltage generator as an input and to generate regulated voltage as output. The clock distribution path may operate on a regulated voltage, the regulated voltage having a value proportional to a threshold value associated with a plurality of devices included in the clock distribution path.

20 Claims, 7 Drawing Sheets

CLOCK DISTRIBUTION ARCHITECTURE

FIELD OF THE INVENTION

The present application relates to a clock distribution architecture and, more particularly to a voltage-temperature, drift resistant and power efficient clock distribution architecture.

BACKGROUND

Synchronous, dynamic, random-access memory that consumes less power such as low-power double data rate ("LPDDR") is often used for mobile computers and devices (e.g., mobile phones, etc.). In LPDDR5, the clock distribution for the read path of the LPDDR5 memory interface suffers from various problems and often requires excessive re-training along the clock distribution path, which increases power consumption and reduces the throughput of the interface.

SUMMARY

In one or more embodiments of the present disclosure, a voltage-temperature drift resistant and power efficient clock distribution circuit is provided. The circuit may include a current generator and a voltage generator configured to receive an input from the current generator. The circuit may also include a clock distribution path configured to receive a regulated voltage. The voltage regulator may be configured to receive a reference voltage from the voltage generator and to generate a regulated voltage. The clock distribution path may operate on a regulated voltage. The regulated voltage may include a value proportional to a threshold value associated with a plurality of devices included in the clock distribution path.

One or more of the following features may be included. In some embodiments, the regulated voltage may be independent of a $V_{DD}$ supply. The voltage regulator circuit may include a differential amplifier and a power p-channel metal-oxide semiconductor ("PMOS") located between the voltage generator and the clock distribution path. The reference voltage may be independent of a $V_{DD}$ supply. The regulated voltage may be process and temperature dependent. The voltage generator may include a programmable resistor ladder. The programmable resistor ladder may be in parallel with one or more threshold voltage sensing devices. The circuit may include an analog to digital converter configured to convert an analog reference voltage into a digital code. The circuit may further include a digital to analog converter configured to convert the digital code into a local analog reference voltage. The clock distribution path may include a read path for a Low-Power Double Data Rate 5 (LPDDR5) memory interface.

In one or more embodiments of the present disclosure a method for voltage-temperature drift resistant and power efficient clock distribution method is provided. The method may include generating a current using a current generator and receiving an input from the current generator at a voltage generator. The method may further include receiving a reference voltage from the voltage generator at a regulator input and generating a regulated output voltage on which the clock distribution path operates. The regulated voltage may include a value proportional to a threshold value associated with a plurality of devices included in the clock distribution path.

One or more of the following features may be included. In some embodiments, the regulated voltage may be independent of a $V_{DD}$ supply. The method may include providing a differential amplifier between the voltage generator and the clock distribution path. The reference voltage may be independent of a $V_{DD}$ supply. The regulated voltage may be process and temperature dependent. The voltage generator may include a programmable resistor ladder. The programmable resistor ladder may be in parallel with one or more threshold voltage sensing devices. The method may further include converting an analog reference voltage into a digital code using an analog to digital converter and/or converting the digital code into a local analog reference voltage using a digital to analog converter. The clock distribution path may include a read path for a Low-Power Double Data Rate 5 (LPDDR5) memory interface.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
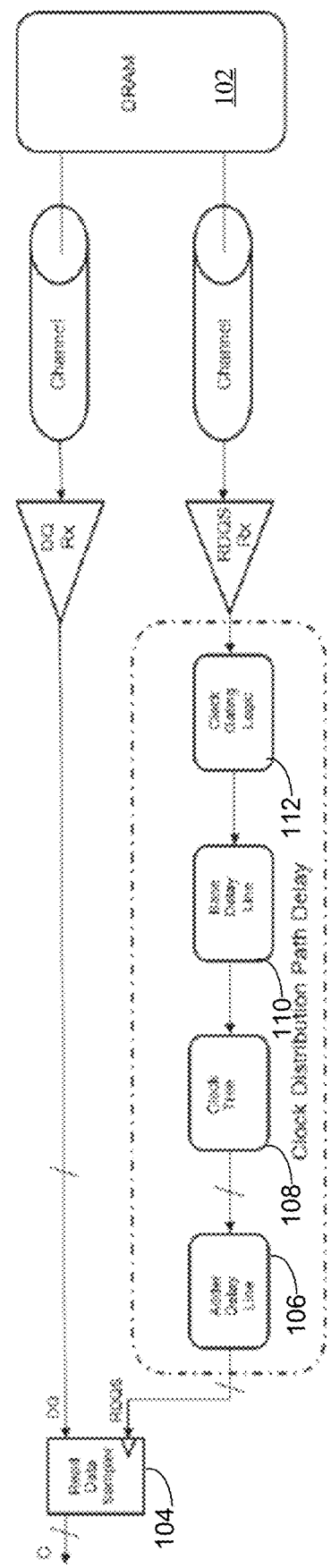
FIG. 1 is a diagram of an architecture showing an example clock distribution path.

Embodiments of the present disclosure are directed towards a new clock distribution path architecture which operates on a process and temperature dependent regulated voltage (referred to herein as "VREG"). The regulator helps in reducing the high frequency, power supply noise induced jitter (referred to herein as "PSU") of the clock distribution path.

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. In the drawings, the thicknesses of layers and regions may be exaggerated for clarity. Like reference numerals in the drawings may denote like elements.

Referring now to FIG. 1, a diagram of an architecture 100 showing an example clock distribution path is provided. In an LPDDR5 interface the read data Q strobe ("RDQS") received from DRAM 102 may need to pass through different digital blocks before it reaches flip flop 104, where the received data ("DQ") may be sampled by the RDQS. At higher data rates it may be difficult to make the delay of the clock distribution path less than 1 unit interval ("UI") and hence early RDQS edges are used to sample the data at read data sampler 104. One or more delay lines 106, 110 may be used in the clock distribution path to align the early RDQS edges in the center of DQ eye for different received DQ bits in parallel. Depending upon the board level skew and data rate a multiple UI delay may be necessary, which needs to be added in the RDQS path by using delay line cells. During initialization of the system, the delay line may be trained to align the RDQS transition edge in the middle of DQ eye for different bits. However, after training the voltage and temperature may drift in either direction and hence the drift in voltage and temperature may disturb the alignment of RDQS edges with DQ. This may require very frequent re-training for aligning the RDQS transition edge in the middle of the DQ eye. As the frequency of re-training increases, the power consumption of the system increases and it may also reduce the throughput of the interface. Accordingly, to address the issues discussed above, embodiments of the present disclosure are directed towards a voltage-temperature drift resistant clock distribution architecture, which may remove the need of very frequent re-training for RDQS transition edge alignment in the middle of the DQ eye.

Figure 2:
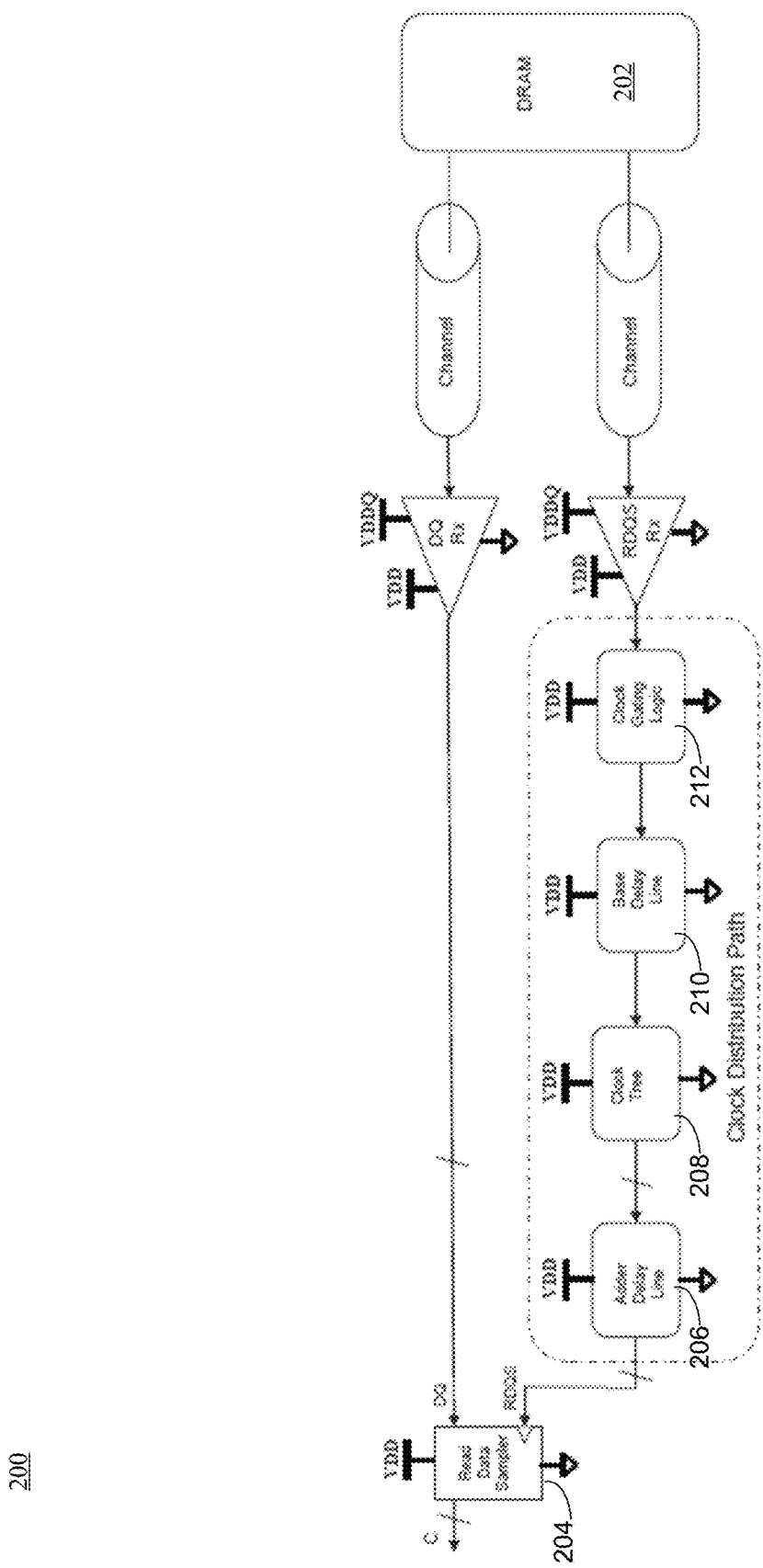
FIG. 2 is a diagram of an architecture showing an example clock distribution path for an LPDDR5 interface in a read mode.

Referring now to FIG. 2, a diagram of an architecture 200 showing an example clock distribution path for an LPDDR5 interface in a read mode is provided. In operation, an early RDQS edge may be used and delayed by using one or more delay lines 206, 210, which may be distributed to different bits by using clock tree 208. Base delay line 210 may be used to adjust the common path RQDS delay. Adder delay line 206 may be used to adjust the delay, which may accommodate the bit-to-bit skew at the system level. This example suffers from a number of limitations. For example, since the clock distribution path is operating on a $V_{DD}$ supply, any drift in $V_{DD}$ supply may change the propagation delay of the RDQS edge and hence it disturbs the timing margin at read data sampler 204. As such, more frequent RDQS edge alignment re-training may be needed which reduces the system level throughput and increases the power consumption. The propagation delay of delay element cells are strongly correlated to process, voltage, and temperature ("PVT") and hence at fast PVT, the effective delay of the delay element may be far lower. Accordingly, in order to obtain the same amount of delay more delay elements need to be added in the RDQS path, which increases the power consumption of the clock distribution path.

Figure 3:
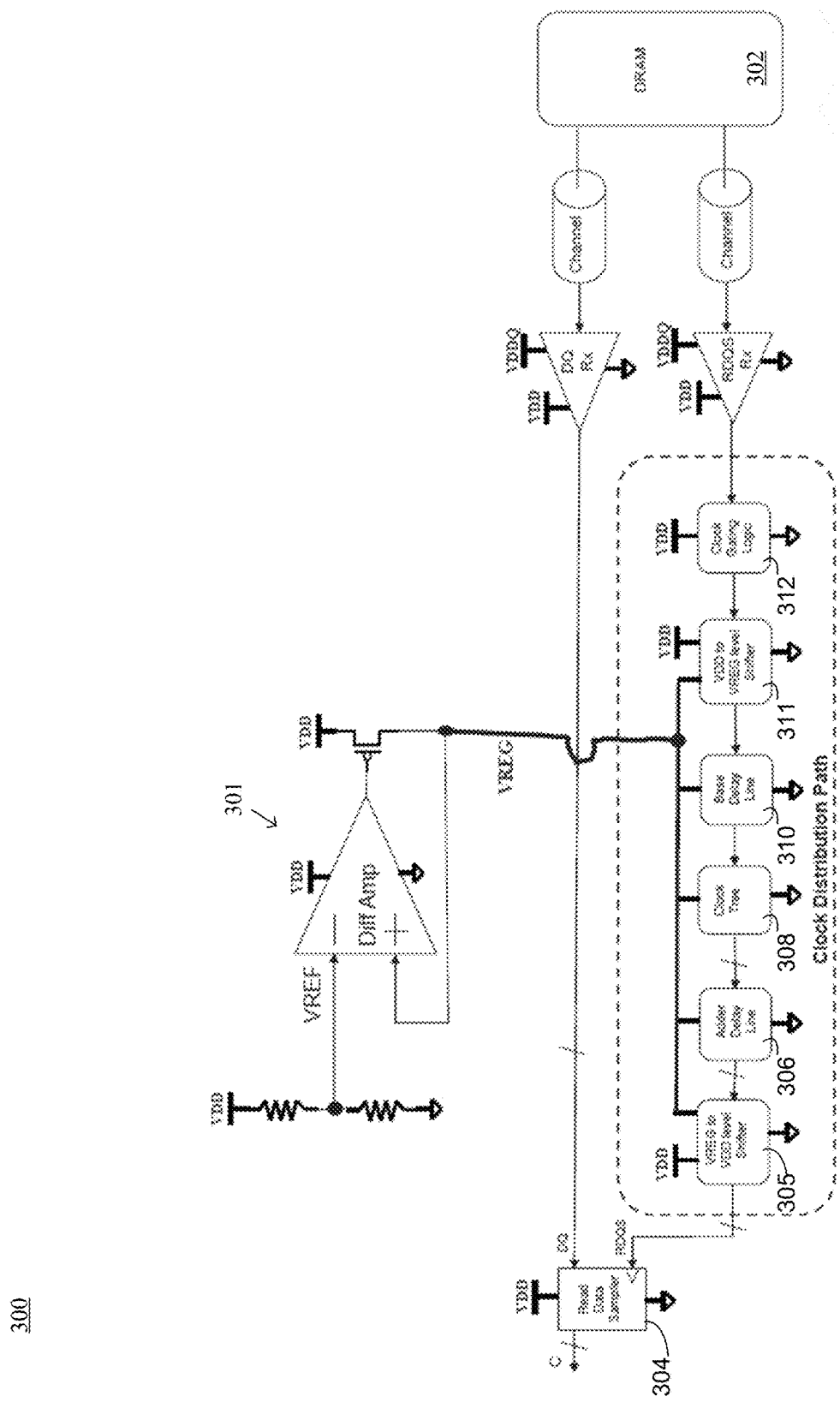
FIG. 3 is a diagram of an architecture showing an example clock distribution path for an LPDDR5 interface in a read mode including a voltage regulator.

Referring now to FIG. 3, a diagram of an architecture 300 showing an example clock distribution path for an LPDDR5 interface in a read mode including voltage regulator 301 is provided. This particular configuration may provide an advantage as the use of voltage regulator 301 may reduce the high frequency power supply noise induced jitter. This example also suffers from a number of limitations. For example, since the reference voltage ("$V_{REF}$") is dependent upon $V_{DD}$, the impact of $V_{DD}$ drift on clock path delay is very high. Since $V_{REF}$ is not process and temperature dependent the impact of temperature drift on the propagation delay of the clock distribution path is very high. Again, frequent re-training may be needed to align the RDQS edge in the center of DQ eye.

As discussed above, the propagation delay of the delay element is a strong function of PVT. In a conventional clock distribution path operating directly on the $V_{DD}$ supply, the slowest corner delay is twice that of the fast corner delay. The higher drift in propagation delay of clock distribution path due to voltage and temperature drift needs more frequent re-training for centering the RDQS in the middle of DQ eye. The frequent re-training reduces the system level throughput as well as increases system level power consumption. Since the propagation delay of the delay element at the fastest PVT corner is lowest, more delay elements may need to be added in the clock distribution path to obtain a similar amount of RDQS path delay. More delay elements at the fast corner increases the power consumption of the clock distribution path by a factor of at least two.

Figure 4:
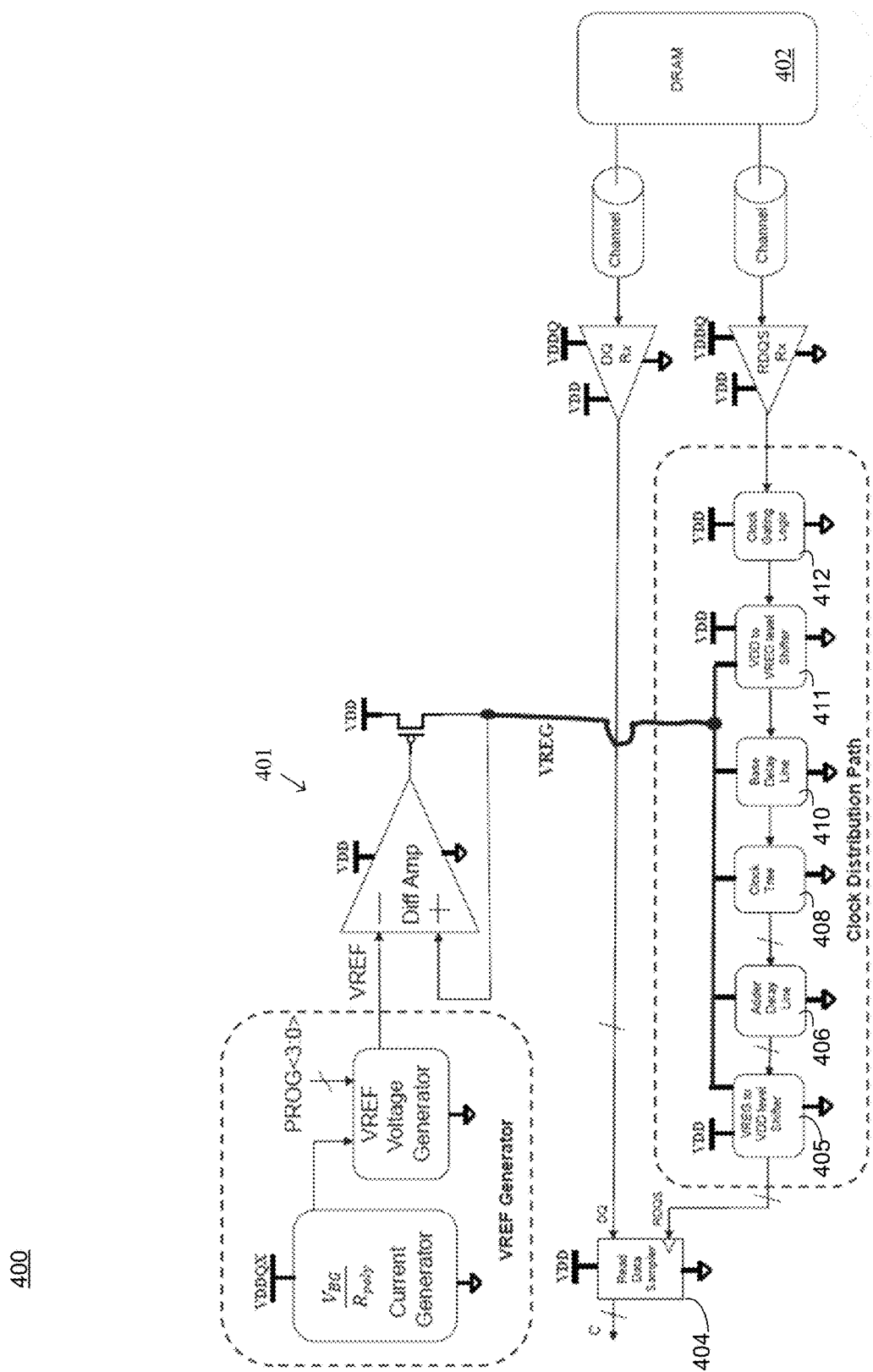
FIG. 4 is a diagram of an architecture showing an example clock distribution path for a single byte application according to an embodiment of the present disclosure.

Referring now to FIG. 4, a diagram of an architecture 400 showing an example clock distribution path according to an embodiment of the present disclosure is provided. This particular example depicts a voltage-temperature, drift resistant, and power efficient clock distribution path. Architecture 400 includes a new clock distribution path architecture which operates on a process and temperature dependent regulated voltage ("VREG"). Voltage regulator 401 helps in reducing the high frequency PSIJ of the clock distribution path. In some embodiments, architecture 400 may utilize a $V_{DD}$ supply independent reference voltage ("VF") for voltage regulator 401. This will make the regulator output voltage VMG, $V_{DD}$ supply independent and hence the clock distribution path delay will become $V_{DD}$ voltage drift resistant.

Additionally and/or alternatively, in some embodiments, VF for voltage regulator 401 may be proportional to the threshold voltage (Vth) of devices used in delay line cell. This may reduce the value of the regulator output voltage at fast corner so that the propagation delay of delay element increase at fast corner. This may also increase the value of regulator output voltage at slow corner so that the propagation delay of the delay element decreases at a slow corner. This may reduce the value of regulator output voltage at higher temperatures where Vth is lower and hence increases the propagation delay of the delay element. This may increase the value of regulator output at lower temperature where Vth of the devices is higher and hence reduces the propagation delay of the delay element. This may also help in improving the power supply rejection ("PSR") of the output voltage of voltage regulator 401 due to lowering of the effective VF node impedance.

In operation, the proposed clock distribution path may operate on a regulated voltage VMG whose value may be independent of the $V_{DD}$ supply and proportional to the threshold voltage (Vth) of the devices used in the clock distribution path. This makes the propagation delay of clock distribution path resistant to $V_{DD}$ voltage direct current ("DC") drift. The high frequency PSR of voltage regulator output may be kept high so that the impact of the high frequency noise of the $V_{DD}$ supply is minimized on the clock distribution path. Embodiments included herein may assist in improving the PSR of voltage regulator 401 as at fast PVT corners the VREG value may be lower. Thus, the power p-channel metal-oxide semiconductor ("PMOS") may have a higher saturation margin which may help in improving the worst corner PSR.

Figure 5:
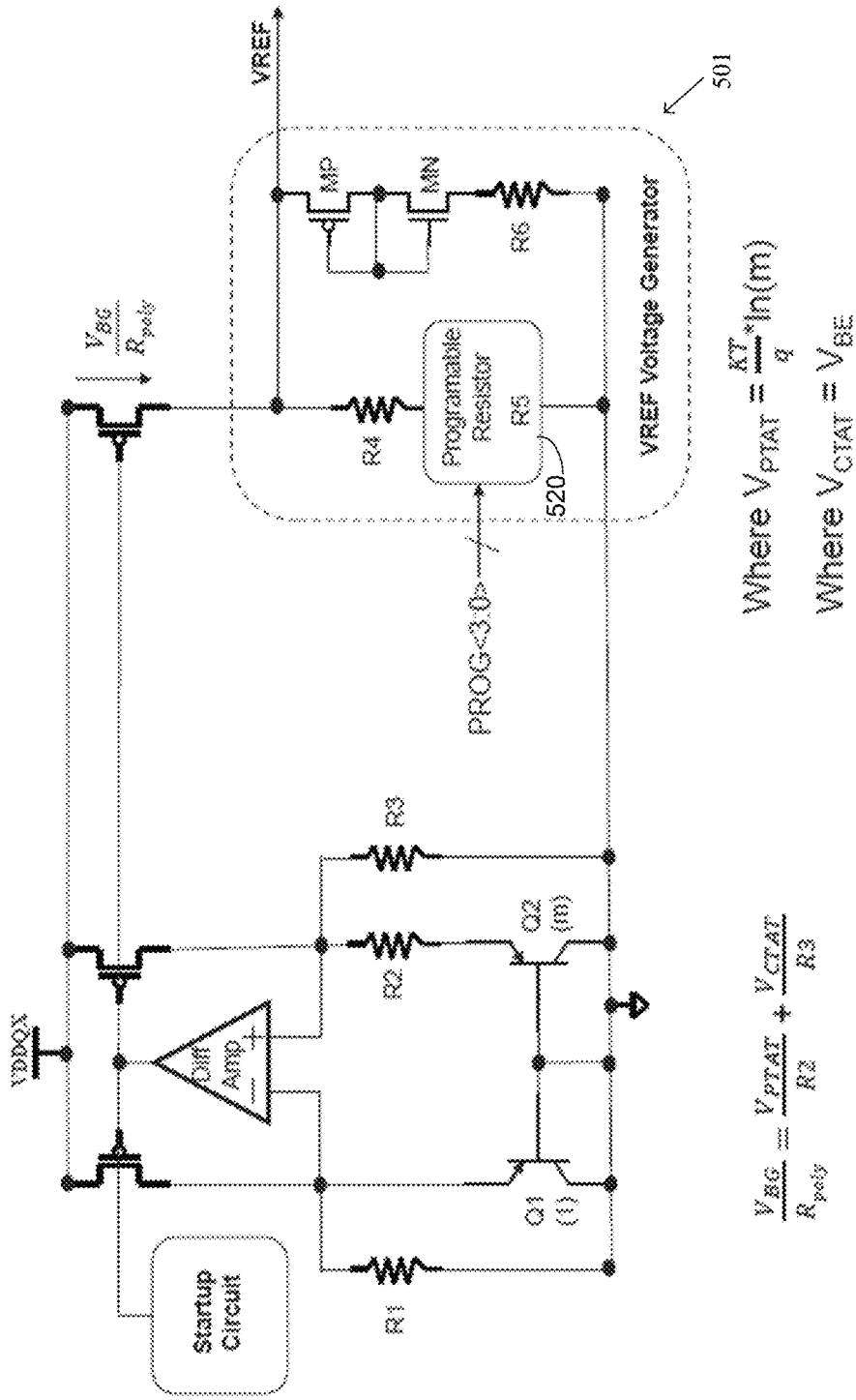
FIG. 5 is a diagram of a reference voltage generator circuit architecture according to an embodiment of the present disclosure.

Referring now to FIG. 5, a diagram showing a reference voltage generator circuit architecture 500 according to an embodiment of the present disclosure is provided. Here the $V_{BG}$ represents the bandgap voltage which is independent of Process, Voltage and Temperature (PVT). The constant bandgap voltage $V_{BG}$ is derived by adding the Voltage Proportional To Absolute Temperature ($V_{PTAT}$) with Voltage Complimentary To Absolute Temperature ($V_{CTAT}$). The $R_{poly}$ represent the on-chip polysilicon resistors. This example depicts a $V_{REF}$ voltage generator 501 having a programmable resistor ladder 520 included therein. Here, the $V_{BG}/R_{poly}$ current may fed into programmable resistor ladder 520 in parallel with Vth sensing devices. At slow process and lower temperature corner, the Vth of devices MP and MN may be highest and hence the least current may go to Vth sensing branch and most of the current may flow in programmable resistor 520 and hence the value of $V_{REF}$ will be highest at SS/−40C corner. In contrast, at fast process and high temperature corner, the Vth of the devices MP and MN may be the least and hence a significant portion of $V_{BG}/R_{poly}$ current may pass through the MP and MN devices. This may reduce the effective current in programmable resistor branch and hence the voltage $V_{REF}$ may be least at FF/125C corner. Since the $V_{BG}/R_{poly}$ current is independent of $V_{DD}$ supply, the reference voltage $V_{REF}$ may also be independent of $V_{DD}$ Supply.

Figure 6:
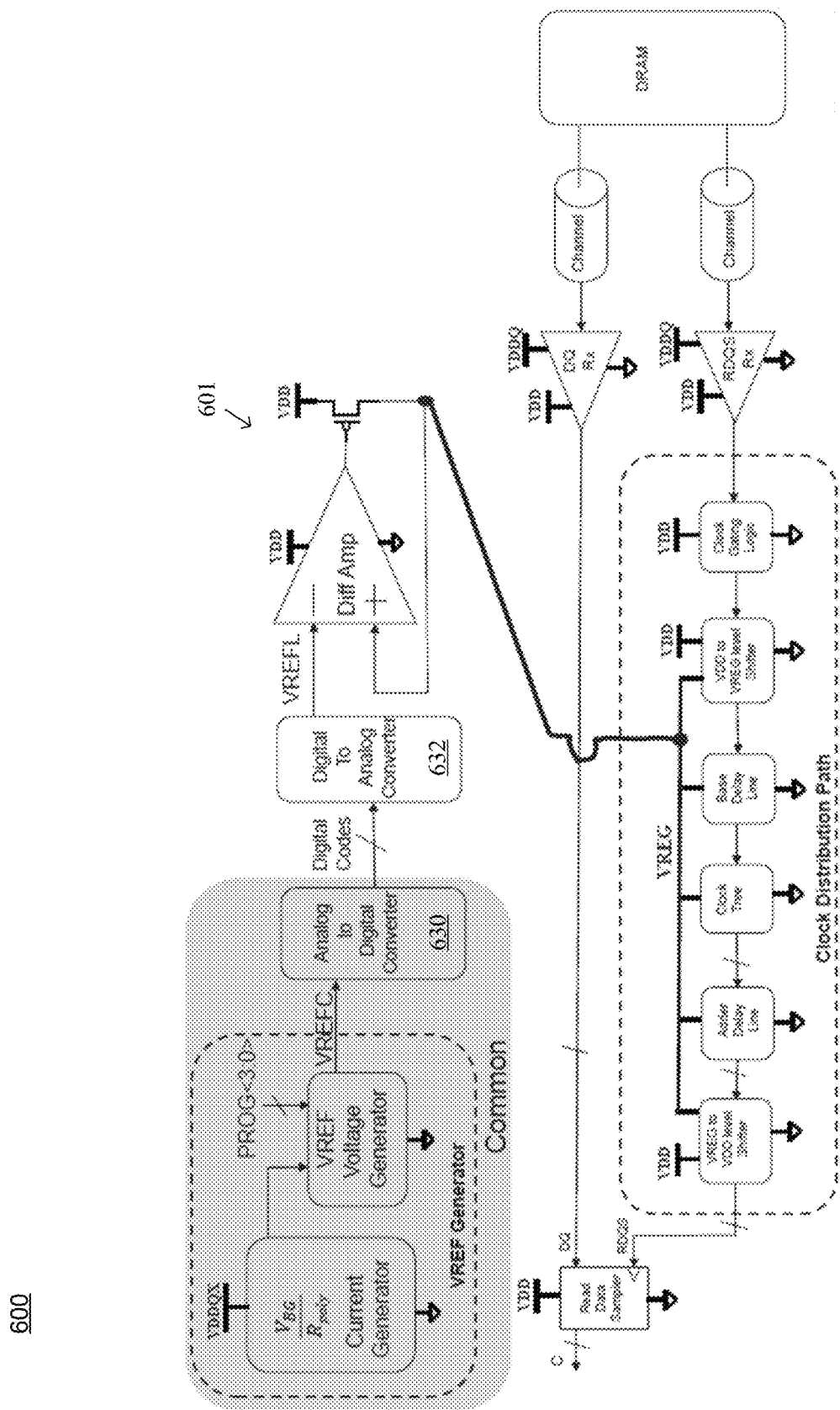
FIG. 6 is a diagram of an architecture showing an example clock distribution path for a multiple byte application according to an embodiment of the present disclosure.

Referring now to FIG. 6, a diagram of an architecture 600 showing an example clock distribution path according to an embodiment of the present disclosure is provided. This example depicts a voltage-temperature drift resistant and power efficient clock distribution path for multiple byte applications. For multiple byte applications, the proposed architecture integration may be simplified by using an analog to digital converter ("ADC") and digital to analog converter ("DAC") pair. In this way, ADC 630 may be used to convert the common analog reference voltage "$V_{REFC}$" into one or more digital codes. These digital codes may be distributed to different bytes using digital routing. DAC 632 may be used before voltage regulator 601 inside each byte to convert these distributed digital codes into local analog reference voltage "$V_{REFL}$" which may work as reference voltage for voltage regulator 601.

Figure 7:
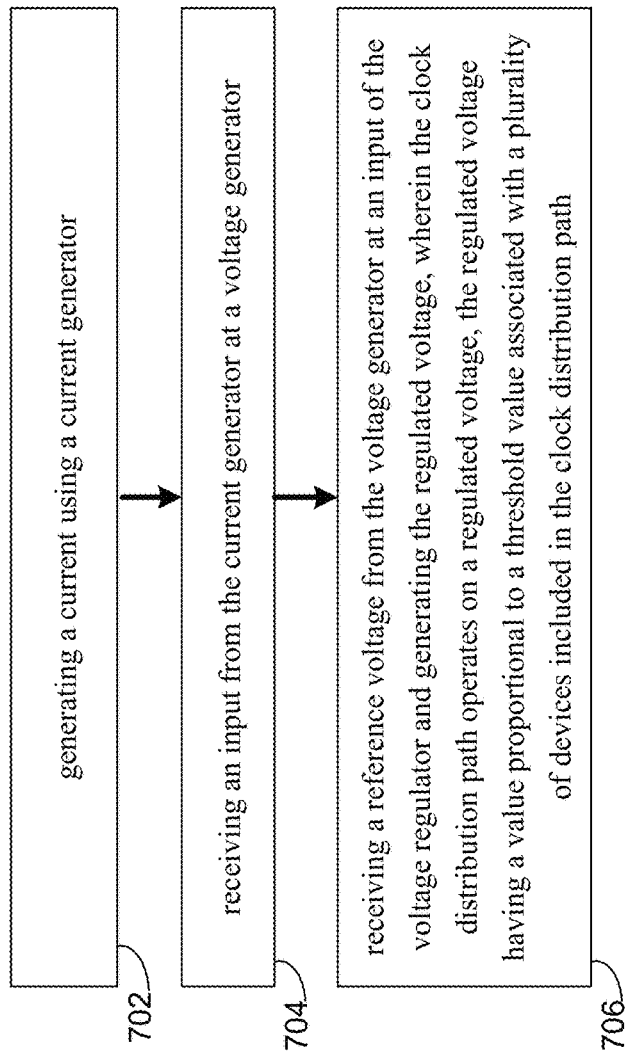
FIG. 7 is an example showing an exemplary flowchart according to an embodiment of the present disclosure.

Referring now to FIG. 7, an exemplary flowchart 700 for voltage-temperature drift resistant and power efficient clock distribution according to an embodiment of the present disclosure is provided. Embodiments may include generating 702 a current using a current generator and receiving 704 an input from the current generator at a voltage generator. The method may further include receiving 706 a reference voltage from the voltage generator at a clock distribution path, wherein the clock distribution path operates on a regulated voltage. The regulated voltage may include a value proportional to a threshold value associated with a plurality of devices included in the clock distribution path. Numerous additional operations are also within the scope of the present disclosure.

Embodiments of the present disclosure provide numerous advantages over prior approaches. As discussed above, and using the teachings of the present disclosure, the clock distribution path delay may be independent of $V_{DD}$ supply and hence there is negligible change in delay due to $V_{DD}$ supply drift. In the proposed architecture the regulator reference voltage may be proportional to the threshold voltage (Vth) of the devices used in the delay line. Thus, reduces the drift of delay of clock distribution due to temperature drift. In some embodiments, the propagation delay of the delay element may be increased at a fast PVT corner by reducing the value of $V_{REF}$. The propagation delay may be decreased at a slow PVT corner by increasing the value of $V_{REF}$. This helps to reduce the power consumption of delay line as well as reduce the area of delay line circuit. The proposed architecture of clock distribution path helps in improving the power, performance and area ("PPA") of the clock distribution path.

It will be apparent to those skilled in the art that various modifications and variations can be made in the embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A voltage-temperature drift resistant and power efficient clock distribution circuit comprising:
   a current generator;
   a voltage generator configured to receive an input from the current generator; and
   a clock distribution path configured to receive a regulated voltage derived using a voltage regulator that receives a reference voltage from the voltage generator as input, wherein the clock distribution path operates on the regulated voltage, the regulated voltage having a value proportional to a threshold value associated with a plurality of delay elements included in the clock distribution path,
   wherein a propagation delay of at least one delay element of the plurality of delay elements is configured to increase at a first process, voltage, and temperature (PVT) corner by reducing a value of the reference voltage, and
   wherein the propagation delay of the at least one delay element of the plurality of delay elements is configured to decrease at a second PVT corner by increasing the value of the reference voltage.

2. The voltage-temperature drift resistant and power efficient clock distribution circuit of claim 1, wherein the regulated voltage is independent of a $V_{DD}$ supply.

3. The voltage-temperature drift resistant and power efficient clock distribution circuit of claim 1, further comprising:

a differential amplifier and a power p-channel metal-oxide semiconductor ("PMOS") located between the voltage generator and the clock distribution path.

4. The voltage-temperature drift resistant and power efficient clock distribution circuit of claim 1, wherein the reference voltage is independent of a $V_{DD}$ supply.

5. The voltage-temperature drift resistant and power efficient clock distribution circuit of claim 1, wherein the regulated voltage is process and temperature dependent.

6. The voltage-temperature drift resistant and power efficient clock distribution circuit of claim 1, wherein the voltage generator includes a programmable resistor ladder.

7. The voltage-temperature drift resistant and power efficient clock distribution circuit claim 6, wherein the programmable resistor ladder is in parallel with one or more threshold voltage sensing devices.

8. The voltage-temperature drift resistant and power efficient clock distribution circuit of claim 1, further comprising:
an analog to digital converter configured to convert an analog reference voltage into a digital code.

9. The voltage-temperature drift resistant and power efficient clock distribution circuit claim 8, further comprising:
a digital to analog converter configured to convert the digital code into a local analog reference voltage.

10. The voltage-temperature drift resistant and power efficient clock distribution circuit of claim 1, wherein the clock distribution path is a read path for an Low-Power Double Data Rate 5 (LPDDR5) memory interface.

11. A voltage-temperature drift resistant and power efficient clock distribution method comprising:
generating a current using a current generator;
receiving an input from the current generator at a voltage generator; and
receiving a reference voltage from the voltage generator at an input of the voltage regulator and generating the regulated voltage, wherein the clock distribution path operates on the regulated voltage, the regulated voltage having a value proportional to a threshold value associated with a plurality of delay elements included in the clock distribution path,
wherein a propagation delay of at least one delay element of the plurality of delay elements is configured to increase at a first process, voltage, and temperature (PVT) corner by reducing a value of the reference voltage, and
wherein the propagation delay of the at least one delay element of the plurality of delay elements is configured to decrease at a second PVT corner by increasing the value of the reference voltage.

12. The voltage-temperature drift resistant and power efficient clock distribution method of claim 11, wherein the regulated voltage is independent of a $V_{DD}$ supply.

13. The voltage-temperature drift resistant and power efficient clock distribution method of claim 11, further comprising:
providing a differential amplifier a power p-channel metal-oxide semiconductor ("PMOS") between the voltage generator and the clock distribution path.

14. The voltage-temperature drift resistant and power efficient clock distribution method of claim 11, wherein the reference voltage is independent of a $V_{DD}$ supply.

15. The voltage-temperature drift resistant and power efficient clock distribution method of claim 11, wherein the regulated voltage is process and temperature dependent.

16. The voltage-temperature drift resistant and power efficient clock distribution method of claim 11, wherein the voltage generator includes a programmable resistor ladder.

17. The voltage-temperature drift resistant and power efficient clock distribution method claim 16, wherein the programmable resistor ladder is in parallel with one or more threshold voltage sensing devices.

18. The voltage-temperature drift resistant and power efficient clock distribution method of claim 11, further comprising:
converting an analog reference voltage into a digital code using an analog to digital converter.

19. The voltage-temperature drift resistant and power efficient clock distribution method claim 18, further comprising:
converting the digital code into a local analog reference voltage using a digital to analog converter.

20. The voltage-temperature drift resistant and power efficient clock distribution method of claim 11, wherein the clock distribution path is a read path for an Low-Power Double Data Rate 5 (LPDDR5) memory interface.

* * * * *